United States Patent
Myller et al.

(10) Patent No.: US 10,186,869 B2
(45) Date of Patent: Jan. 22, 2019

(54) METHOD FOR TESTING ELECTRIC SYSTEM AND ELECTRIC SYSTEM

(71) Applicant: ABB Technology AG, Zürich (CH)

(72) Inventors: Mikko Myller, Espoo (FI); Tomi Riipinen, Järvenpää (FI)

(73) Assignee: ABB Schweiz AG, Baden (CH)

( * ) Notice: Subject to any disclaimer, the term of this patent is extended or adjusted under 35 U.S.C. 154(b) by 403 days.

(21) Appl. No.: 14/972,547

(22) Filed: Dec. 17, 2015

(65) Prior Publication Data

US 2016/0218513 A1    Jul. 28, 2016

(30) Foreign Application Priority Data

Jan. 27, 2015    (EP) ................................. 15152638

(51) Int. Cl.
| | | |
|---|---|---|
| *H02J 1/00* | (2006.01) | |
| *H02J 3/00* | (2006.01) | |
| *H02J 3/38* | (2006.01) | |
| *H02M 7/44* | (2006.01) | |
| *G06F 1/26* | (2006.01) | |
| *G01R 31/42* | (2006.01) | |
| *H02M 7/493* | (2007.01) | |
| *H02J 3/18* | (2006.01) | |

(52) U.S. Cl.
CPC .............. *H02J 3/383* (2013.01); *G01R 31/42* (2013.01); *G06F 1/26* (2013.01); *H02J 3/18* (2013.01); *H02M 7/44* (2013.01); *H02M 7/493* (2013.01)

(58) Field of Classification Search
CPC ..... H02J 3/383; H02J 3/38; H02J 3/18; G01R 31/42; H02M 7/493; H02M 7/44; G06F 1/26

USPC .......................................................... 307/82
See application file for complete search history.

(56) References Cited

U.S. PATENT DOCUMENTS

| | | | |
|---|---|---|---|
| 2003/0218888 A1 | 11/2003 | Suzui et al. | |
| 2012/0051101 A1* | 3/2012 | El-Barbari | H02M 7/515 363/49 |
| 2014/0103726 A1* | 4/2014 | Martin | H02M 7/493 307/65 |

(Continued)

FOREIGN PATENT DOCUMENTS

| | | |
|---|---|---|
| CN | 1977440 A | 6/2007 |
| CN | 101577490 A | 11/2009 |

(Continued)

OTHER PUBLICATIONS

European Patent Office, European Search Report issued in European Patent Application No. 15152638.1 dated Aug. 20, 2015, 3 pp.

(Continued)

*Primary Examiner* — Richard Tan
(74) *Attorney, Agent, or Firm* — J. Bruce Schelkopf; Taft Stettinius & Hollister LLP

(57) ABSTRACT

A method for testing an electric system and an electric system comprising a first inverter (10) and one or more second inverters (11, 12, 1N), and control means (40) configured to start the first inverter (10), provide and sustain with the first inverter (10) an AC voltage of a predetermined magnitude and a predetermined frequency at an AC output of the first inverter, start at least one second inverter (11, 12, 1N), and supply with the first inverter (10) reactive power to the started at least one second inverter (11, 12, 1N).

14 Claims, 1 Drawing Sheet

(56) References Cited

U.S. PATENT DOCUMENTS

| | | | |
|---|---|---|---|
| 2015/0016161 A1 | 1/2015 | Tanaka et al. | |
| 2015/0115721 A1* | 4/2015 | Norrga | H02J 3/38 307/82 |
| 2016/0072292 A1* | 3/2016 | Rogers | H02J 3/46 307/62 |

FOREIGN PATENT DOCUMENTS

| | | |
|---|---|---|
| CN | 103219910 A | 7/2013 |
| CN | 103733464 A | 4/2014 |
| CN | 1038556064 A | 6/2014 |
| CN | 103959589 A | 7/2014 |
| CN | 104272547 A | 1/2015 |
| EP | 2613164 A1 | 7/2013 |
| JP | 2008228454 A | 9/2008 |

OTHER PUBLICATIONS

English translation of Chinese Office Action dated Jan. 31, 2018, Chinese Application No. 201610037063.3; ABB Technology AG; 5 pgs.

\* cited by examiner

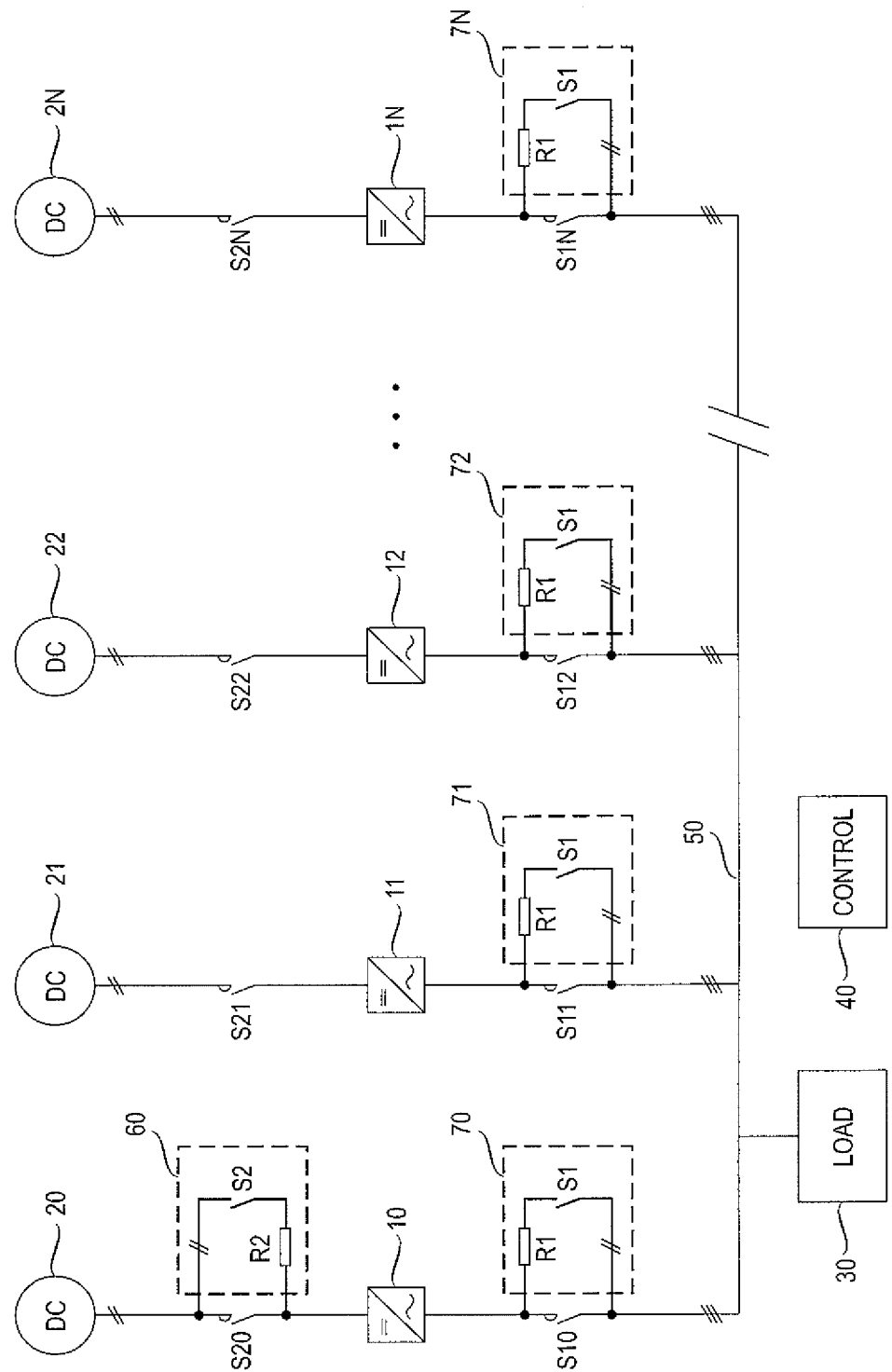

METHOD FOR TESTING ELECTRIC SYSTEM AND ELECTRIC SYSTEM

FIELD OF THE INVENTION

The invention relates to a method for testing an electric system, and to an electric system.

BACKGROUND OF THE INVENTION

Electric systems may need to be tested during a commissioning thereof. Such electric systems may include converter systems comprising inverters which convert DC (direct current) power from a DC power source to AC (alternating current) power. Herein 'inverter' generally refers to an electronic device or circuitry that is able to convert direct current to alternating current. An example of the inverter is a semiconductor bridge implemented by means of controllable semiconductor switches, such as IGBTs (Insulated-gate Bipolar Transistor) or FETs (Field-Effect Transistor), which are controlled according to a modulation or control scheme used.

One example of an electric system comprising inverters is a photovoltaic system, such as a photovoltaic power plant, in which photovoltaic panels supply DC power to inverters which convert the DC power to AC power, which may further be supplied to various AC loads via an AC network, for example. Large photovoltaic power plants may comprise a plurality of parallel inverters each receiving DC power from an array of photovoltaic panels.

In commissioning of electric systems, such as a photovoltaic power plant, a connection to the AC network may not be available before the system is commissioned. For example, components of the electric system may need to be tested before the system is allowed to be connected to the AC network, such as a public electrical grid, in order to guarantee that no disturbance will be caused to the AC network upon the connection. However, a proper testing of some components of the electric system may require that an AC voltage with a predetermined magnitude and a predetermined frequency is present on the AC side of the system. For example, the testing of inverters may necessitate that an AC voltage corresponding to that of an AC network that the electric system is to be connected to is present at the AC output of the inverters.

One possible solution to the above problem is to use a separate grid forming generator to generate the required AC voltage and thus to provide a temporary AC network emulating the actual AC network, such as a public electrical grid, for commissioning purposes. Moreover, an artificial load may be used to feed power from the electric system to be tested. However, the use of such separate grid forming generators and artificial loads may cause substantial extra costs and the transportation and setup of such external equipment to possibly remote locations may be time consuming.

BRIEF DESCRIPTION OF THE INVENTION

The object of the invention is thus to provide a method and an apparatus for implementing the method so as to solve or at least alleviate the above problem or at least to provide an alternative solution. The object of the invention is achieved with a method, a computer program product, and a system that are characterized by what is stated in the independent claims. Preferred embodiments of the invention are described in the dependent claims.

The invention is based on the idea of generating an AC network with one of the inverters included in the electric system to be commissioned, such that one or more inverters of the electric system can be tested. The invention is also based on the idea of transferring reactive power between the inverters included in the electric system to be commissioned via the generated AC network in order to test the inverters.

An advantage of the solution of the invention is that the electric system to be commissioned can be tested without a separate generator or an artificial load and thus the extra costs involved in such external equipment can be avoided.

BRIEF DESCRIPTION OF THE FIGURES

In the following, the invention will be described in more detail in connection with preferred embodiments and with reference to the accompanying drawing, in which FIG. 1 illustrates an example of an electric system according to an embodiment.

DETAILED DESCRIPTION OF THE INVENTION

The application of the invention is not limited to any specific system, but it can be used in connection with various electric systems. Moreover, the use of the invention is not limited to systems employing any specific fundamental frequency or any specific voltage level, for example.

FIG. 1 illustrates a simplified example of an electric system. The FIGURE shows only components necessary for understanding the invention. The exemplary system of FIG. 1 comprises a plurality of inverters 10, 11, 12 . . . 1N. The inverters 10, 11, 12, 1N can be separate inverter devices or inverter modules of a multi-module inverter unit, for example. A DC input of each of the inverters 10, 11, 12, 1N may be connected to a DC power source 20, 21, 22 . . . 2N, respectively. While in the example of FIG. 1 there is a different inverter-specific DC power source 20, 21, 22, 2N connectable to each of the inverters 10, 11, 12, 1N, it is also possible that some or all the inverters share a common DC power source. An example of a DC power source is a photovoltaic panel or an array of two or more photovoltaic panels. Other types of DC power sources can also be utilized. There may be one or more switches S20, S21, S22 . . . S2N between the inverter 10, 11, 12, 1N and the DC power source 20, 21, 22, 2N enabling the connection and disconnection of the inverter to/from the DC power source. The switches S20, S21, S22, S2N may be contactors or controllable power semiconductor switches, for example. Further, an AC output of each of the inverters 10, 11, 12, 1N may be connected to a common AC side connector 50, such as a busbar, via which the electric system may be further connected to an external AC network, such as a public electrical grid (not shown), in order to supply power from the DC power sources 20, 21, 22, 2N to the external AC network, when the electric system is in normal use. There may be one or more switches S10, S11, S12 . . . S1N between the inverter 10, 11, 12, 1N and the AC side connector 50 enabling the connection and disconnection of the inverter to/from the AC side connector 50. The switches S10, S11, S12, S1N may be contactors or power semiconductor switches, for example. While the switches S10, S11, S12, S1N, S20, S21, S22, S2N are shown as separate elements in the example of FIG. 1, some or all of them could also be integrated into the respective inverters 10, 11, 12, 1N, for example. The switches S10, S11, S12, S1N, S20, S21, S22, S2N can also at least functionally be part of the respective inverters such that the inverter may control the functioning of the respective switches.

The exemplary system of FIG. 1 further comprises, in connection with the first inverter 10, a DC charging circuit 60 and an AC charging circuit 70. The DC charging circuit may comprise a controllable switch S2, such as a contactor, and a current limiting element, such as a resistance R2, which may comprise one or more resistors, for example. Alternatively, the DC charging circuit may comprise a controllable semiconductor switch with which current flowing through the DC charging circuit may be controlled with suitable switching thereof. With the DC charging circuit 60 a DC circuit of the inverter 10 can be charged from the DC power source 20 when the switch S20 between the inverter 10 and the DC power source 20 is open (non-conducting). This way a possible power surge can be avoided or alleviated when the inverter 10 is started into operation and the switch S20 between the inverter 10 and the DC power source 20 and the switch S10 between the inverter 10 and the AC side connector 50 are closed. In a similar manner, the AC charging circuit may comprise a controllable switch S1, such as a contactor, and a current limiting element, such as a resistance R1, which may comprise one or more resistors, for example. Alternatively, the AC charging circuit may comprise a controllable semiconductor switch with which current flowing through the AC charging circuit may be controlled with suitable switching thereof. With the AC charging circuit 70 the DC circuit of the inverter 10 may be charged from the AC side connector 50 when the switch S10 between the inverter 10 and AC side connector 50 is open (non-conducting) provided that there is AC power available from the AC side connector 50. Also this way a possible power surge can be avoided or alleviated when the inverter 10 is started into operation and the switch S20 between the inverter 10 and the DC power source 20 and the switch S10 between the inverter 10 and the AC side connector 50 are closed. The exemplary system of FIG. 1 further comprises, in connection with the other inverters 11, 12, 1N an AC charging circuit 71, 72 . . . 7N corresponding to the AC charging circuit 70 of the first inverter 10. The possible DC charging circuit 60 and the possible AC charging circuits 70, 71, 72, 7N may be separate devices and circuits, as shown, or part of the respective inverters 10, 11, 12, 1N, i.e. situated in the same housing with the respective inverters, for example.

The exemplary system of FIG. 1 further comprises a control arrangement 40, which preferably may control the operation of the inverters 10, 11, 12, 1N. Moreover, the control arrangement 40 is preferably able to control the various switches S10, S11, S12, S1N, S20, S21, S22, S2N and the DC and AC charging circuits 60, 70, 71, 72, 7N. For the sake of clarity, FIG. 1 does not show control connections between the control arrangement 40 and the entities to be controlled. Such a control arrangement 40 or a corresponding entity may be part of any of the inverters 10, 11, 12, 1N or a separate arrangement, for example. It is also possible that the control arrangement is divided into several units residing in different locations.

According to an embodiment, a testing of an electric system comprising a first inverter 10 and one or more second inverters 11, 12, 1N may be performed as follows:

a) First by starting the first inverter 10 and connecting the DC input of the first inverter 10 to at least one DC power source 20. In other words, in the exemplary system of FIG. 1, the first inverter is started and switch S20 is closed (conducting). According to an embodiment, the starting of the first inverter 10 comprises charging the DC circuit of the first inverter from the DC power source. Thus, the DC circuit of the first inverter 10 may be charged with the DC charging circuit 60, for example, before the switch S20 between the inverter 10 and the DC power source 20 is closed, if necessary.

b) Next by providing and sustaining with the first inverter 10 an AC voltage of a predetermined magnitude and a predetermined frequency at the AC output of the first inverter. In other words, in the exemplary system of FIG. 1, the first inverter 10 is used to generate an AC voltage of a predetermined magnitude and a predetermined frequency at the AC output of the first inverter, thus effectively creating an AC network or grid on the AC conductor 50 connected to the AC output of the first inverter when switch S10 is closed. Preferably switch S10 is closed in connection with this step. The magnitude and the frequency of the AC voltage generated depend on the system but they preferably correspond to the values of an AC network that the electric system is to be connected to after commissioning. The magnitude of the AC voltage generated may be low, medium or high, for example. The frequency of the AC voltage generated may be about 50 or 60 Hz, for example.

c) Next by starting at least one second inverter 11, 12, 1N, and connecting the AC output of the started at least one second inverter to the AC output of the first inverter 10. In other words, in the exemplary system of FIG. 1, at least one of the second inverters 11, 12, 1N is started and corresponding switches S11, S12, S1N are closed. Also switch S10 is closed if it was not closed already earlier e.g. in connection with step b). According to an embodiment, the starting of the at least one second inverter 11, 12, 1N comprises charging the DC circuit of the at least one second inverter from the AC power supplied by the first inverter 10. Thus, the DC circuit of the at least one second inverter 11, 12, 1N may be charged with the AC charging circuit 71, 72, 7N, respectively, for example, before the switch S11, S12, S1N, respectively, between the at least one second inverter 11, 12, 1N and the AC conductor 50 is closed, if necessary.

d) And finally, by supplying with the first inverter (10) reactive power to the started at least one second inverter 11, 12, 1N. In other words, in the exemplary system of FIG. 1, the first inverter (10) is used to transmit reactive power to the started at least one of the second inverters 11, 12, 1N in order to test the proper functioning of the at least one of the second inverters 11, 12, 1N. The power may be transmitted at a predetermined level or at different predetermined levels and for predetermined time or times, depending on the testing procedure required, for example. The predetermined transmitted reactive power level may be such that the resulting value of AC current flowing between the inverters to be tested essentially corresponds to a nominal value of AC current of the inverters, for example.

According to an embodiment, a possible testing procedure according to which the first inverter (10) is used to transmit reactive power to the started at least one of the second inverters 11, 12, 1N may comprise first increasing the level of the reactive power transmitted from the first inverter in a ramp-like manner from zero up to a predetermined level above the zero. The steepness of the ramp may depend on the power of the DC power source 20, 21, 22, 2N from which the energy is supplied, for example. For example, in case of a DC power source comprising one or more photovoltaic panels, the power of the DC power source may depend on the time of the day and the radiation power of the sun. The achieved power level being transmitted may be held for a predetermined time, such as a few seconds, minutes or hours, depending on the system. For example, it may be desirable to hold the achieved power level long enough for components, such as bus-bars and/or electric components of the system, to reach a desired temperature, such as a normal operating temperature. Then it is possible to decrease the level of the reactive power transmitted from the first inverter also in a ramp-like manner back to zero to end the test procedure and that way reduce or avoid any unnecessary thermal stress to the system.

According to an embodiment, the transmission of reactive power between the inverters may take place such that the first inverter (10) outputs reactive power (capacitive, for example) through its AC output to the started second inverters 11, 12, 1N. As a result, the voltage of the created AC network or grid on the AC conductor 50 starts rising. This is then compensated by the started second inverters 11, 12, 1N by producing corresponding opposite reactive power (inductive, for example) such that the voltage remains within a predetermined range. This embodiment does not require any synchronization or communication between the inverters. According to another embodiment, the transmission of reactive power between the inverters may take place such that the inverters, i.e. the first inverter and the started second inverters, are synchronized with each other and the first inverter is given a reactive power instruction and the started second inverters are given an opposite reactive power instruction such that the voltage on the AC conductor 50 remains within a predetermined range. Thus, the term 'synchronized' herein generally refers to a situation in which two or more inverters are controlled in a synchronized manner such that they essentially simultaneously receive and implement the power instructions to set the output powers thereof. The power instructions to different inverters may originate from the same source, such as the control arrangement 40, or from different sources as long as the delivery of the power instructions is synchronized.

According to an embodiment, step d) further comprises supplying with the first inverter (10) active power to the started at least one second inverter (11, 12, 1N). In other words, the first inverter (10) may supply e.g. the operating power required by the started second inverters. In addition or alternatively, according to an embodiment, one or more of the second inverters may be connected to a DC power supply by connecting the DC input of the second inverter to at least one DC power source 21, 22, 2N. In the exemplary system of FIG. 1, corresponding switches S21, S22, S2N are closed. This way the started second inverters may receive AC power including active power from one or more DC power sources 21, 22, 2N.

According to an embodiment, steps c) and d) above may be performed for each second inverter 11, 12, 1N. Moreover, steps c) and d) above may be performed for each second inverter 11, 12, 1N simultaneously or at different times. This may depend on the power handling capability of the load 30, for example.

According to an embodiment, the testing of the electric system comprising the first inverter 10 and one or more second inverters 11, 12, 1N may further comprise:

e) Connecting a DC input of at least one started second inverter to at least one of said one or more DC power sources (21, 22, 2N). In the exemplary system of FIG. 1, corresponding switch or switches S21, S22, S2N is/are closed. This way the started second inverters may receive AC power including active power from one or more DC power sources 21, 22, 2N.

f) Providing and sustaining with said at least one started second inverter 11, 12, 1N the AC voltage of the predetermined magnitude and the predetermined frequency at the AC output of the at least one second inverter. In other words, in the exemplary system of FIG. 1, at least one second inverter 11, 12, 1N is used to generate the AC voltage of the predetermined magnitude and the predetermined frequency at the AC output of the at least one second inverter 11, 12, 1N, the inverter thus sustaining the AC network or grid on the AC conductor 50 connected to the AC output of the at least one second inverter 11, 12, 1N.

g) Restarting the first inverter 10 and supplying with said at least one started second inverter (11, 12, 1N) reactive power to the first inverter. Thus, also the first inverter 10 may be tested when the AC network or grid on the AC conductor 50 is now maintained by the at least one second inverter 11, 12, 1N.

The above embodiments using one first inverter 10 provide the advantage that only one inverter may need to have the DC charging circuit 60 while the other inverters may only need the AC charging circuit. However, it is possible that there are more than one first inverter, each possibly comprising a DC charging circuit.

According to an embodiment, it is additionally possible to use a separate artificial load to test the active power output of the inverters at even higher power levels. Accordingly, the exemplary system of FIG. 1 can further comprise a load 30 connected to the AC side connector 50 via which the load 30 may be connected to the AC outputs of the inverters 10, 11, 12, 1N. The inverters to be tested may then be controlled to supply power from a DC source to the load 30, for example. The load 30 may be a resistor bank or any other kind of load such as an RLC load. It is also preferable that the load 30 is controllable such that it can be switched on and off and/or its magnitude can be controlled, for example. The magnitude of the load 30 may be controlled, e.g. with the control arrangement 40, such that the load 30 emulates loads of different kinds, for example.

The control arrangement 40 or other means controlling the electric system according to any one of the embodiments herein, or a combination thereof, may be implemented as one physical unit or as two or more separate physical units that are configured to implement the functionality of the various embodiments. Herein the term 'unit' generally refers to a physical or logical entity, such as a physical device or a part thereof or a software routine. The control arrangement 40 according to any one of the embodiments may be implemented at least partly by means of one or more computers or corresponding digital signal processing (DSP) equipment provided with suitable software, for example. Such a computer or digital signal processing equipment preferably comprises at least a working memory (RAM) providing storage area for arithmetical operations, and a central processing unit (CPU), such as a general-purpose digital signal processor. The CPU may comprise a set of registers, an arithmetic logic unit, and a control unit. The CPU control unit is controlled by a sequence of program instructions transferred to the CPU from the RAM. The CPU control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the invention, or a part thereof, may further comprise suitable input means for receiving e.g. measurement and/or control data, and output means for outputting e.g. control or other data. It is also possible to use a specific integrated circuit or circuits, or discrete electric components and devices for implementing the functionality according to any one of the embodiments.

The invention may be implemented in existing electric system components such as inverters or inverter units. Present inverters or inverter units may comprise processors and memory that may be utilized in the functions according to the various embodiments described herein. Thus, all modifications and configurations required for implementing an embodiment in existing electric system components, such as inverters or inverter units may be performed as software routines, which may be implemented as added or updated software routines. If at least part of the functionality of the invention is implemented by software, such software may be provided as a computer program product comprising computer program code which, when run on a computer, causes the computer or corresponding arrangement to perform the functionality according to the embodiments as described herein. Such a computer program code may be stored or generally embodied on a computer readable medium, such as suitable memory, e.g. a flash memory or an optical memory, from which it is loadable to the unit or units executing the program code. In addition, such a computer program code implementing the invention may be loaded to the unit or units executing the computer program code via a suitable data network, for example, and it may replace or update a possibly existing program code.

It is obvious to a person skilled in the art that as technology advances, the basic idea of the invention can be implemented in a variety of ways. Consequently, the invention and its embodiments are not restricted to the above examples, but can vary within the scope of the claims.

The invention claimed is:

1. A method for testing an electric system comprising a first inverter and one or more second inverters, the method comprising:
 a) starting the first inverter and connecting a DC input of the first inverter to at least one DC power source;
 b) providing and sustaining with the first inverter an AC voltage of a predetermined magnitude and a predetermined frequency at the AC output of the first inverter;
 c) starting at least one second inverter and connecting an AC output of the started at least one second inverter to the AC output of the first inverter; and
 d) supplying with the first inverter reactive power to the started at least one second inverter and supplying with the first inverter active power to the started at least one second inverter.

2. The method of claim 1, wherein steps c) and d) are performed for each second inverter either simultaneously or at different times.

3. The method of claim 1, wherein the at least one DC power source comprises one or more photovoltaic panels.

4. The method of claim 1, wherein in step a) the starting of the first inverter comprises charging a DC circuit of the first inverter from at least one DC power source.

5. The method of claim 1, wherein in step c) the starting of the at least one second inverter comprises charging a DC circuit of the at least one second inverter from AC power supplied by the first inverter.

6. The method of claim 1, the method further comprising:
 e) connecting a DC input of at least one started second inverter to at least one of said one or more DC power sources;
 f) providing and sustaining with said at least one started second inverter the AC voltage of the predetermined magnitude and the predetermined frequency at the AC output of the at least one second inverter connected to a load; and
 g) restarting the first inverter and supplying with said at least one started second inverter reactive power to the first inverter.

7. A computer program product comprising computer program code embodied on a non-transitory computer readable medium, wherein execution of the program code in a computer causes the computer to carry out the steps of the method according to claim 1.

8. An electric system comprising:
 a first inverter;
 one or more second inverters;
 one or more DC power sources; and
 control means configured to:
 a) start the first inverter and connect a DC input of the first inverter to at least one DC power source;
 b) provide and sustain with the first inverter an AC voltage of a predetermined magnitude and a predetermined frequency at the AC output of the first inverter;
 c) start at least one second inverter and connect an AC output of the started at least one second inverter to the AC output of the first inverter; and
 d) supply with the first inverter reactive power to the started at least one second inverter and supply with the first inverter active power to the started at least one second inverter.

9. The electric system of claim 8, wherein the control means are configured to perform c) and d) for each second inverter either simultaneously or at different times.

10. The electric system of claim 8, wherein the DC power source comprises one or more photovoltaic panels.

11. The electric system of claim 8, wherein, during a), the control means are configured to charge a DC circuit of the first inverter from at least one of said one or more DC power sources when starting the first inverter.

12. The electric system of claim 8, wherein, during c), the control means are configured to charge a DC circuit of the at least one second inverter from AC power supplied by the first inverter when starting the at least one second inverter.

13. The electric system of claim 8, wherein the control means are configured to:
 e) connect a DC input of at least one started second inverter to at least one of said one or more DC power sources;
 f) provide and sustain with said at least one started second inverter the AC voltage of the predetermined magnitude and the predetermined frequency at the AC output of the at least one second inverter connected to a load; and
 g) restart the first inverter and supply with said at least one started second inverter reactive power to the first inverter.

14. An electric system comprising:
 a first inverter;
 one or more second inverters;
 one or more DC power sources; and
 a control arrangement comprising a processor and a non-transitory memory storing instructions that, when executed by the processor, cause the control arrangement to:
 start the first inverter and connect a DC input of the first inverter to at least one DC power source;
 provide and sustain with the first inverter an AC voltage of a predetermined magnitude and a predetermined frequency at the AC output of the first inverter;
 start at least one second inverter and connect an AC output of the started at least one second inverter to the AC output of the first inverter;

supply with the first inverter reactive power to the started at least one second inverter; and supply with the first inverter active power to the started at least one second inverter.

\* \* \* \* \*